United States Patent
Pitzele

(10) Patent No.: US 6,545,890 B2
(45) Date of Patent: Apr. 8, 2003

(54) FLANGED TERMINAL PINS FOR DC/DC CONVERTERS

(75) Inventor: Lennart Pitzele, Shrewsbury, MA (US)

(73) Assignee: SynQor, Inc., Hudson, MA (US)

( * ) Notice: Subject to any disclaimer, the term of this patent is extended or adjusted under 35 U.S.C. 154(b) by 0 days.

(21) Appl. No.: 09/740,707

(22) Filed: Dec. 19, 2000

(65) Prior Publication Data

US 2001/0030882 A1 Oct. 18, 2001

Related U.S. Application Data

(60) Provisional application No. 60/172,882, filed on Dec. 20, 1999.

(51) Int. Cl.$^7$ .............................. H02M 1/00; H01R 9/00
(52) U.S. Cl. ........................................... 363/147; 29/852
(58) Field of Search ................................ 363/147, 146; 439/48, 78, 79, 98, 83; 174/72, 72 A; 29/842, 846, 852, 843

(56) References Cited

U.S. PATENT DOCUMENTS

| | | | |
|---|---|---|---|
| 4,046,957 A | 9/1977 | Taylor et al. | 174/72 A |
| 4,767,343 A | 8/1988 | Ehrgott | 439/83 |
| 4,767,344 A | 8/1988 | Noschese | 439/83 |
| 4,872,846 A | 10/1989 | Clark | 439/83 |
| 4,990,720 A | 2/1991 | Kaufman | 174/524 |
| 5,055,055 A | 10/1991 | Bakker | 439/78 |
| 5,075,821 A | 12/1991 | McDonnal | 361/386 |
| 5,167,513 A | 12/1992 | Johnson et al. | 439/78 |
| 5,182,536 A | 1/1993 | Boylan et al. | 336/65 |
| 5,257,165 A | 10/1993 | Chiang | 361/748 |
| 5,456,608 A | 10/1995 | Rogers et al. | 439/48 |
| 5,533,665 A * | 7/1996 | Sinclair et al. | 228/180.1 |
| 5,621,636 A | 4/1997 | Tanigawa et al. | 363/147 |
| 5,673,479 A | 10/1997 | Hawthorne | 29/832 |
| 5,743,009 A | 4/1998 | Matsui et al. | 29/843 |
| 5,777,381 A | 7/1998 | Nishida | 257/693 |
| 5,952,716 A | 9/1999 | Dibble et al. | 257/697 |
| 6,230,403 B1 * | 5/2001 | Skoolicas et al. | 29/852 |

FOREIGN PATENT DOCUMENTS

| | | | |
|---|---|---|---|
| EP | 0 717 443 A1 | | 6/1996 |
| JP | 04137790 | | 5/1992 |
| JP | 05218613 | * | 8/1993 |
| JP | 06060923 | | 3/1994 |

OTHER PUBLICATIONS

Power Trends Catalog, Power Trends, Inc., Warrenville, IL, cover page, pp. 1, 20, 36, 38, 40, 50, 52, 56, 58, 66, 108, 110, 112, 113, 115, 116, back cover, Jan. 1998.

* cited by examiner

*Primary Examiner*—Rajnikant B. Patel
(74) *Attorney, Agent, or Firm*—Hamilton, Brook, Smith & Reynolds, P.C.

(57) ABSTRACT

A dc/dc converter is mounted to a printed circuit board with rigid terminal pins which extend into a converter substrate to provide electrical connection to circuitry on the substrate. A terminal pin includes a flange which abuts the printed circuit board and spaces the converter substrate from the printed circuit board. Connection to the printed circuit board is made by solder provided between the flange and the circuit board.

54 Claims, 6 Drawing Sheets

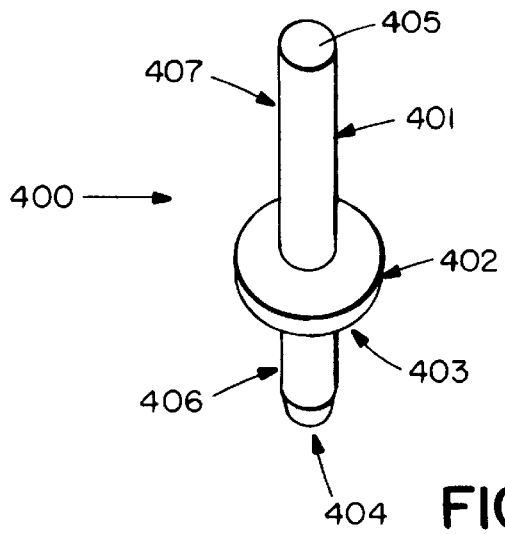
FIG. 4
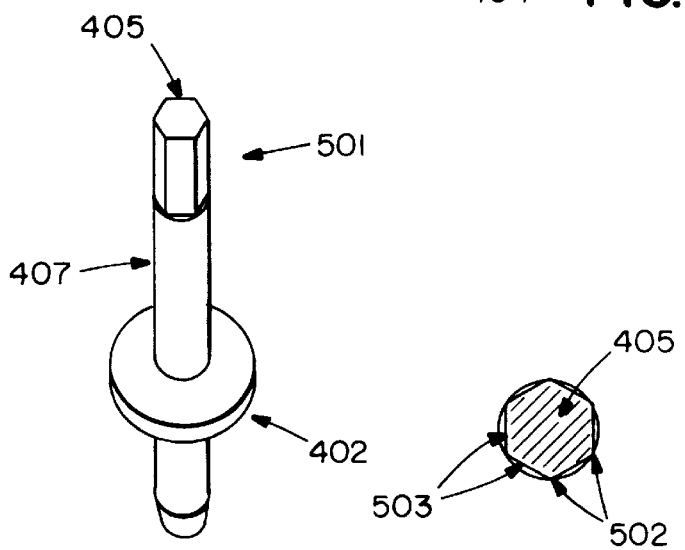
FIG. 5A  FIG. 5B  FIG. 5C

FLANGED TERMINAL PINS FOR DC/DC CONVERTERS

RELATED APPLICATION(S)

This application claims the benefit of U.S. Provisional Application No. 60/172,882, filed on Dec. 20, 1999. The entire teachings of the above application is incorporated herein by reference.

BACKGROUND OF THE INVENTION

Designers are increasingly using distributed power supply architectures for large electronic equipment. With this type of architecture, electrical power is bussed throughout the equipment at a relatively high dc voltage, such as 48 volts. dc/dc converters mounted near the load (and often on the same printed circuit board as the load) then step this high voltage down to the low voltage required by the load (e.g. 3.3V), typically through an isolating transformer.

These point-of-load dc/dc converters typically have a low height (e.g. 0.5") so that the designer can place adjacent load boards close together in a card rack. The plan-view size of the converter must also be as small as possible to leave more room on the load board for the load circuitry. Several standard sizes of converters exist, such as the "Full Brick" (2.4"×4.6"), the "Half-Brick" (2.4"×2.3"), and the "Quarter-Brick" (2.4"×1.45"). Other standard and non-standard sizes exist, as well. In general, the larger a dc/dc converter, the more power it can handle.

Typically, dc/dc converters have a flat bottom surface formed by either a housing or potting material. Terminal pins extend from this surface so that the dc/dc converters can be "through-hole mounted" on a printed circuit board (the "PCB"). When the converter's "through-hole pins" are inserted into the PCB's holes, the bottom surface of the converter makes contact with the PCB to ensure its proper positioning in the z-axis direction.

Recently, "open frame" converters have been developed without a housing or potting. To achieve proper z-axis positioning, these converters use plastic or metal "standoffs" that keep the PCB and the converter's substrate separated by a specified distance. Because these standoffs either abut or are attached to the converter's substrate, they take up space on the substrate that could otherwise be used for electronic components. They also partially or totally block the cooling air from flowing under the open frame converter. Finally, the standoff represents an additional cost for the part and for its attachment to the converter.

Most electronic equipment manufactured today uses Surface Mount Technology (SMT) to attach their components to both the top and bottom surfaces of a PCB. In this process, solder paste is first screen-printed onto the PCB in the locations of the component pads. The components are then placed onto the solder paste. Finally, the PCB is passed through a reflow oven in which the solder paste melts and then solidifies during the cool-down stage.

In comparison, dc/dc converters, with their through-hole pins, are attached to the PCB by either manual soldering or by an automated production process called "wave soldering". With this latter process, the PCB is first preheated and then passed over a molten pool of solder. The solder comes in contact with the bottom of the PCB, and it wicks into the through-holes and solidifies after the PCB leaves the pool of solder.

A typical manufacturing process that requires both SMT and wave soldering would first attach the SMT parts on the PCB, then insert the through-hole components, and finally pass the PCB through the wave soldering machine. This process requires that the SMT components mounted on the bottom side of the PCB pass through a molten pool of solder.

As the distance between the leads on SMT packages gets smaller, it becomes more difficult to pass these packages through a wave solder process and not have solder bridges form between adjacent leads. Furthermore, the heating associated with the wave soldering process compromises the quality of the SMT components and their attachments to the PCB. Manufacturers of electronic equipment are therefore interested in avoiding the use of wave soldering altogether. Often, the dc/dc converter is the only component on their boards that requires wave soldering.

In response to this desire, several power supply manufacturers have created dc/dc converters designed to be surface mounted to a PCB. Instead of a few, large diameter through-hole pins, some of these converters have many smaller leads designed for surface mounting. In general, these surface mount pins make a dc/dc converter's overall footprint larger than it might otherwise be since the pins typically extend beyond the converter's original footprint. Alternatively, at least one manufacturer has introduced a product that uses a surface mountable ball-grid. In this product, each through-hole pin of a standard converter is replaced with a conductive ball of sufficient diameter to permit the converter to be attached to the PCB with SMT techniques.

One important problem with all of these approaches for making a surface mountable dc/dc converter is the relative weakness of a surface mount joint compared to a through-hole pin. This problem is particularly important since dc/dc converters have a higher mass than most components, and the mounting joints are therefore more susceptible to shock and vibration stresses.

Another problem with a surface mountable dc/dc converter is that the converter's pins make electrical contact with only the outer conductive layer in the PCB. Normally, the PCB's power and ground planes use inner conductive layers. With a surface mount connection, additional vias (that take up space and add resistance) are therefore required to connect the outer conductive layer to the inner ones.

In comparison, a through-hole mounting is much stronger mechanically. It also provides direct electrical attachment of the pin to the inner conductor layers of the PCB.

SUMMARY OF THE INVENTION

What is needed is a way to solder a through-hole mounted pin with a reflow solder process, instead of using manual or wave soldering.

To address the problems mentioned above, a new through-hole terminal pin is used for mounting dc/dc converters or other circuit modules. In one embodiment, this pin is similar to a standard through-hole pin, but it has a circular flange near its bottom end. The diameter of the flange is greater than the diameter of the PCB hole through which the lower portion of the pin is inserted. The bottom of the flange therefore rests against the PCB's surface. It is located a specified distance from the dc/dc converter's substrate so that it provides the function of a stand-off, but without taking up space on the substrate or requiring a separate part. In addition, its interference with the cooling airflow underneath the dc/dc converter is minimal.

In another embodiment, the through-hole pin has a flange near or at the top end of the pin where it makes contact with the dc/dc converter's substrate. The top of this flange rests against the bottom of the substrate. This arrangement improves the mechanical connection of the pin to the dc/dc converter's substrate, and it provides one way to ensure the proper z-axis placement of the pin relative to the substrate.

In a third embodiment, the through-hole pin has one continuous, larger diameter portion that performs the function of separate flanges on either end.

In a fourth embodiment, the end of the pin has a cross-sectional shape that is pointed along its periphery. This pointed shape facilitates press fitting, or swaging, the pin into a hole of either the substrate, the PCB, or both. The press fit holds the pin in place for later soldering in a hand, wave, or reflow process, and it improves the mechanical strength between the pin and the substrate or PCB.

In addition, a process has been invented to permit this new through-hole pin to be soldered to the PCB with a reflow process, instead of using manual or wave soldering. In one embodiment, this process works as follows.

First, the pad around the PCB's through-hole is designed to be commensurate in size and shape with the flange of the converter pin.

Second, solder paste is screen-printed onto the PCB in the locations of the pads for both the SMT components and the dc/dc converter pins.

Third, both the SMT components and the dc/dc converter are placed on the PCB. The dc/dc converter, since it is relatively large and heavy, might be placed manually or by a special machine, although it could be placed by the same machine as the other SMT components. At this point, the bottoms of the flanges sit on top of solder paste, while the lower parts of the through-hole pins are inserted into their PCB holes.

Finally, the PCB is passed through a reflow oven in which the solder paste first melts and then solidifies. During this step, the solder paste between each pin flange and the PCB wicks down into the corresponding PCB hole. The final solder joint between the pin and the PCB will therefore exist both underneath the flange and inside the PCB hole. With a properly designed pad and screening process, there will also be a fillet of solder around the outer edge of the flange to provide additional mechanical stress relief. The result is a very strong mechanical connection between the pin and the PCB, as well as a low resistance electrical connection between the pin and both the inner and outer conductive layers of the PCB.

The flange facilitates this special soldering process. It provides a region in which the solder paste directly contacts both the pin and the PCB. As the solder melts, it readily wicks along the surface of the flange and down the pin such that it fills the gap between the pin and the PCB hole's via metalization.

In another embodiment of the reflow soldering process, the bottom end of the through-hole pin is given a cross-sectional shape that is pointed. When the pin is press fit into the PCB, the points of the pin hold the pin, and therefore the converter, in place. Solder is then applied to the bottom side of the PCB in the region of the hole and its pad. The PCB is then passed through a reflow oven in which the solder paste melts, flows into the gaps between the pin and the hole, and then solidifies.

In this alternative reflow soldering process the end of the inserted pin should not extend beyond the bottom of the PCB. Otherwise, it might interfere with the solder application step. In fact, it is useful for the end of the inserted pin not to reach the bottom side of the PCB (i.e., for the end to be inside the PCB). Such an alignment gives a small "well" in the hole area, which increases the amount of solder that can be applied in this area. A flange near the bottom end of the pin facilitates the correct insertion depth of the pin into the PCB hole, although there are other well-known means for controlling this depth.

This alternative reflow soldering process can also be used to attach the pin to the dc/dc converter's substrate during the construction of the converter.

Thus, in accordance with one aspect of the invention, a dc/dc converter comprises a converter substrate having circuitry thereon. At least one rigid terminal pin directly attaches to the converter substrate and is electrically connected to the circuitry. The terminal pin includes a flange having a shoulder to abut a printed circuit board into which the pin is inserted and to which electrical connection is made. The shoulder may abut the printed circuit board by making direct contact thereto, or through one or more layers of material, such as solder. The shoulder is spaced from the converter substrate to accommodate spacing of the converter substrate from the printed circuit board. Plural pins may together provide the spacing between the converter substrate and the printed circuit board or one or more pins may operate with more conventional standoff mechanisms.

To allow for a subsequent soldering process to, for example, solder the terminal pin to the printed circuit board, the components, materials and solder connections of the converter may be such that they are not adversely affected by a 210° soldering process. In particular, the solder used on the converter substrate has a melting temperature greater than 210° C.

The terminal pin may have a second shoulder which abuts the converter substrate. For example, the second shoulder may be on a second flange with the pin extending from the second flange into the converter substrate. The second flange may be spaced from the first flange. Alternatively, a single flange may extend along a length of a terminal pin to abut both the printed circuit board and the converter substrate. In one embodiment, the flange has a uniform diameter.

The terminal pin may be swage fit into the converter substrate. To that end, the pin may have a pointed cross-section shape. The portion of the terminal pin extending into the converter substrate may also be soldered to the converter substrate such as by a reflow soldering process.

The invention is particularly suited to a converter substrate having circuitry thereon in an open frame construction without a baseplate where the converter substrate is positioned parallel to the printed circuit board.

In accordance with another aspect of the invention, a dc/dc power converter is mounted to a printed circuit board by soldering the converter to the printed circuit board with the terminal pin extending through a circuit board hole and the shoulder of the terminal pin abutting the circuit board to accommodate spacing of the dc/dc converter from the circuit board. Preferably, the solder is applied to the circuit board or shoulder, and the shoulder is thereafter positioned to abut the printed circuit board through the solder. The solder may be applied as a solder paste about the circuit board hole, and the hole may be left substantially free of solder paste when the paste is applied. The assembly may thereafter be subjected to a solder reflow process.

The solder may flow to form a fillet. For example, the solder may flow radially to form a fillet about the flange. The solder may also flow through the hole in the printed circuit board to form a fillet about a portion of the terminal pin exposed beyond the circuit board hole.

Solder may be applied to the holes from an opposite board side of the printed circuit board after insertion of the terminal pins into the holes. Specifically, the solder may be applied from a molten pool of solder positioned below the printed circuit board.

In accordance with another aspect of the invention, solder is preapplied on the shoulder of the flange. For example, the solder on the flange may be in a paste, may be a preform, or may be coated on the shoulder of the flange.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 4 illustrates a through-hole pin with a flange.

FIGS. 5a–c each illustrate a through-hole pin with a flange and an end with a cross-sectional shape that is pointed.

DETAILED DESCRIPTION OF THE INVENTION

A description of preferred embodiments of the invention follows.

Throughout this discussion and in the figures we will assume the cross-section of the pin and its flange is circular. One skilled in the art would know how to incorporate the concepts presented here for other cross-sectional shapes, such as triangular or rectangular.

Figure 1:
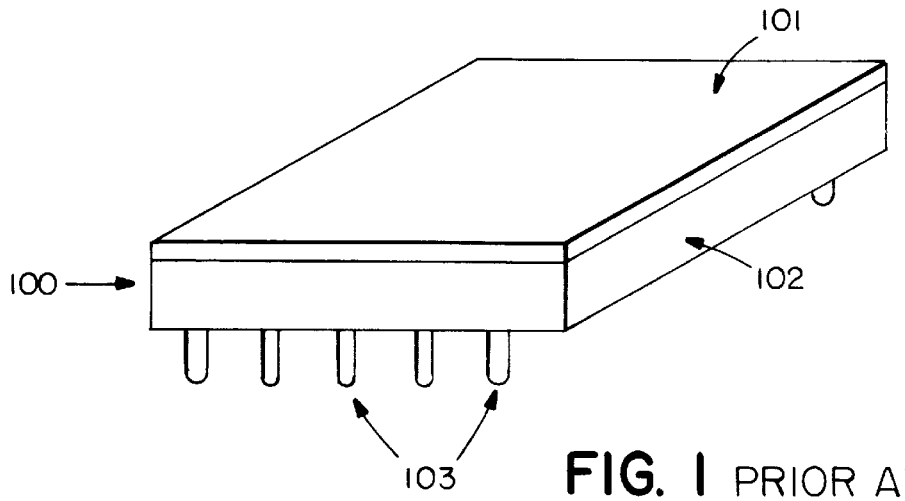
FIG. 1 illustrates a typical dc/dc converter with a housing or potting and through-hole pins.

FIG. 1 shows a typical dc/dc converter 100 with a metal baseplate 101 (to which a heatsink might be attached), a housing or potting 102 (inside which is the converter's circuitry), and its through-hole pins 103. The pins have various diameters (e.g. 40, 60, and 80 mils) to handle their rated current, and various lengths below the housing (e.g. 110, 145, and 180 mils) to pass all the way through the PCB holes.

Figure 2:
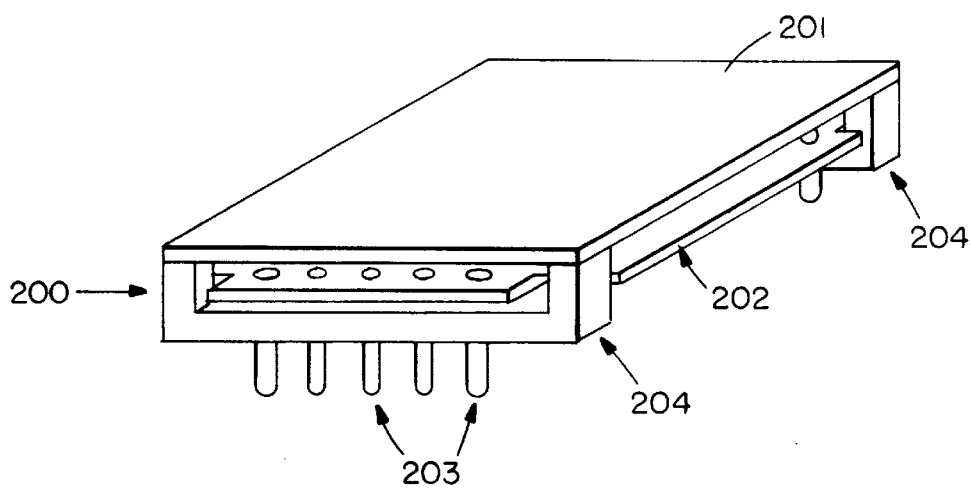
FIG. 2 illustrates an open-frame dc/dc converter (having no housing or potting) that displays one example of a standoff structure.

FIG. 2 shows an open-frame dc/dc converter 200 with a metal baseplate 201 and through-hole pins 203. Since there is no housing or potting in this converter, the converter's circuitry 202 is visible. In some open-frame converters, the circuitry is mounted on a single substrate, and in other converters, two substrates are used. In either case, one substrate (the "baseplate substrate") is either part of, or attached to, the metal baseplate so that the heat dissipated by the power components on this substrate can readily flow to the baseplate.

FIG. 2 also shows a typical standoff structure 204 that is used on the converter with no housing or potting. Standoff 204 is typically made of plastic and is designed to abut the baseplate substrate. As can be seen from this figure, the standoff requires clear space (free of components) on the baseplate substrate. It also reduces the available space for other substrates and their components in the dc/dc converter.

Figure 3:
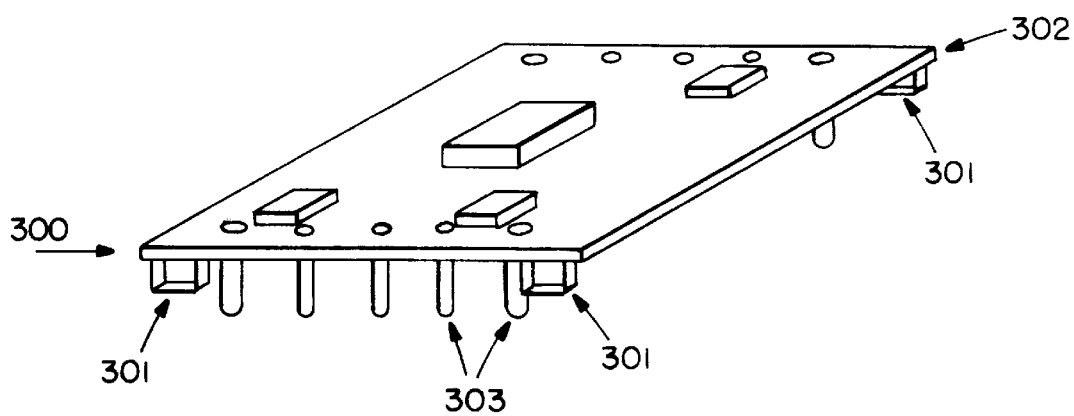
FIG. 3 illustrates an open-frame dc/dc converter without a metal baseplate that displays another example of a standoff structure.

FIG. 3 shows another open-frame dc/dc converter 300 that does not have a metal baseplate. Standoffs 301 are mounted on this converter's single substrate 302, along with the converter's circuitry. The space these standoffs take is not available to circuit components. Through-hole pins 303 are attached to substrate 302 using either a through-hole or a surface mount technique.

FIG. 4 shows a new through-hole pin 400 for dc/dc converters. This pin has a shank 401 (in this case circular with a typical diameter of 80 mils) and it has a flange 402 located along the length of the shank. As shown in this embodiment, the flange is circular with a diameter and a thickness that may, for example, be 120 mils and 40 mils, respectively. The flange diameter is larger than the diameter of the hole in the PCB so that when the bottom portion 406 of the pin (between 403 and 404) is inserted into the hole, the bottom side of the flange makes contact with the top of the PCB.

The bottom side 403 of the flange is located a specific distance from the bottom end 404 of the pin. The length of portion 406 is chosen such that the bottom end of the pin will pass all of the way through the PCB. Typical lengths for 406 are 110 mils, 145 mils, and 180 mils, each chosen to accommodate a different thickness PCB.

Through-hole pin 400 has its top end designed to be through-hole mounted to the dc/dc converter's substrate, as well. The length of the top portion 407 of the pin (between 403 and 405) and the depth to which portion 407 is inserted into the hole of the converter substrate are chosen such that the bottom side 403 of the flange is located a specific distance from the substrate. By doing this, the bottom side of the flange will hold the dc/dc converter substrate this specified distance above the PCB, thereby performing the function of a standoff.

The ends 404 and 405 of the pin can have various shapes, such as conical or spherical, to facilitate the manufacture of the pin and the insertion of the pin into its mounting holes.

The top portion 407 of the pin may have design features that facilitate its mounting to the substrate. For instance, the pin might be press fitted (or swaged) into the substrate's hole to hold it in place until it is soldered and to provide a greater mechanical strength even after it is soldered. If the cross-sectional design of 407 is circular, however, it would make contact with the side of the substrate hole around the entire perimeter. This tight fitting would not allow solder to wick down between the pin and the hole to provide a reliable electrical connection between the pin and the inner conductor layers of the substrate.

FIGS. 5a and 5b show an alternative cross-sectional design for the upper portion 501 of portion 407 of the pin. The points 502 of the hexagonal design for 501 allow the pin to be press fit into the substrate hole while still leaving spaces 503 for the solder to wick down into the hole. Other "pointed cross-sectional shapes," shapes which leave open space about the periphery between the pins and the side wall of the hole, such as other polygons or star-shapes, could accomplish the same function.

Similarly, part or the entire bottom portion 406 of the pin could be given a pointed shape so the dc/dc converter pin could be press fit into the PCB and then soldered. FIG. 5c shows an example 504 of such a pin design.

One way to manufacture a pin with a cross-sectional pointed shape at its top and/or bottom end is to start with a shank of the desired cross-sectional shape. Another way is coin, stamp, impact-extrude, or turn on a screw machine to give an end of the pin its desired pointed shape.

Figure 6:
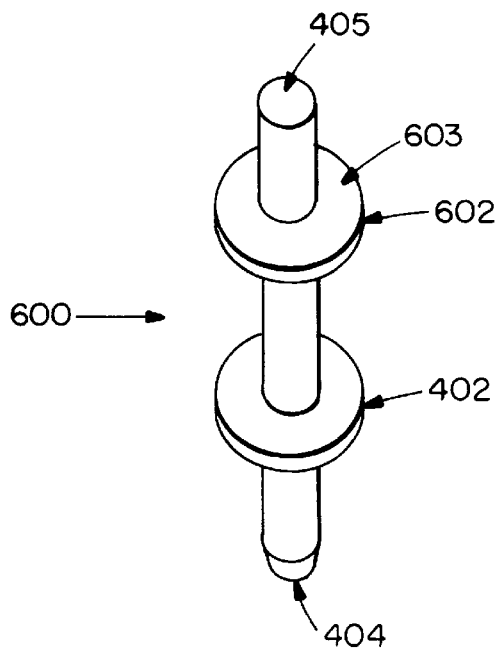
FIG. 6 illustrates a through-hole pin with two flanges.

To facilitate the mounting of the pin to the dc/dc converter's substrate, the pin could have another flange near the top end of the pin, as FIG. 6 shows. The pin could be inserted or press fit into the substrate hole until the topside 603 of the top flange 602 makes contact with the substrate. Flange 602 would thereby ensure that the pin is inserted (or press fit) the correct distance into the substrate hole. It also provides additional mechanical strength to the connection between the pin and the substrate, as well as additional electrical connection between the two.

Figure 7:
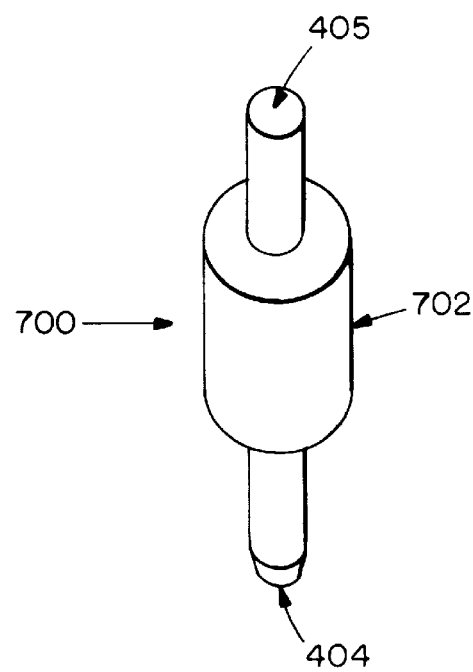
FIG. 7 illustrates a through-hole pin with a single flange that sits against both the PCB and the substrate.

Another variation to the pin is shown in FIG. 7. In this figure, the functions of both the bottom flange 402 and the top flange 602 are accomplished with a single flange 702. The standoff distance required between the substrate and the PCB determines the length of flange 702. This single-flange pin 700 can be easier to manufacture, have greater mechanical strength, and lower electrical and thermal resistance than a two-flange pin design.

Figure 8:
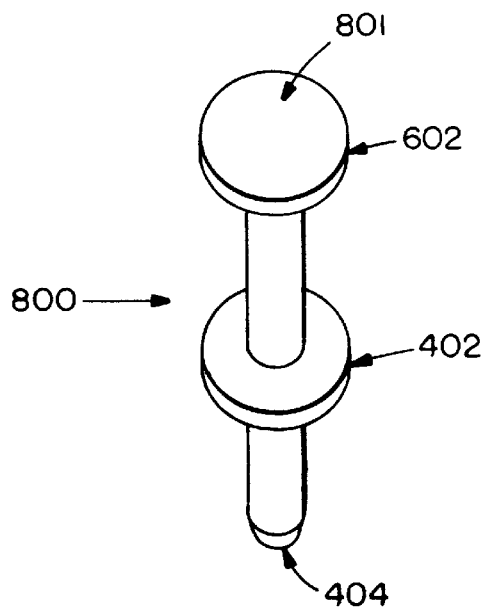
FIG. 8 illustrates a through-hole pin with two flanges where the top flange is flush with the top end of the pin.

Another variation to the pin is shown in FIG. 8. In this embodiment, the connection between the pin and the dc/dc converter substrate uses a surface mount, rather than a through-hole, technique. Flange 602 is now flush with the top end of the pin. As such, its top surface, 801, provides a flat surface that can be soldered to the substrate with an SMT process. In another embodiment, by combining the concepts depicted in FIGS. 7 and 8, the pin would use a single flange with the top of the flange now flush with the top end of the pin.

The new through-hole pin described above can be wave- or hand-soldered to the PCB. It can also be reflow-soldered to the PCB with a process similar to that used for SMT components. As such, the new pin combines the mechanical and electrical advantages of a through-hole pin with the convenience and compatibility of an SMT pin.

The method by which the new pin can be reflow-soldered to the PCB is as follows.

Figure 9A:
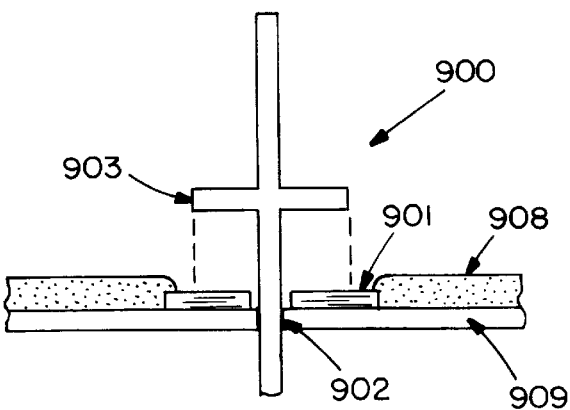
FIGS. 9a–e illustrate using a reflow process to solder a flanged through-hole pin to a PCB or a substrate.
Figure 9B:
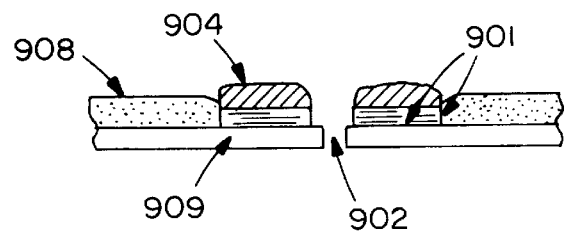
Figure 9C:
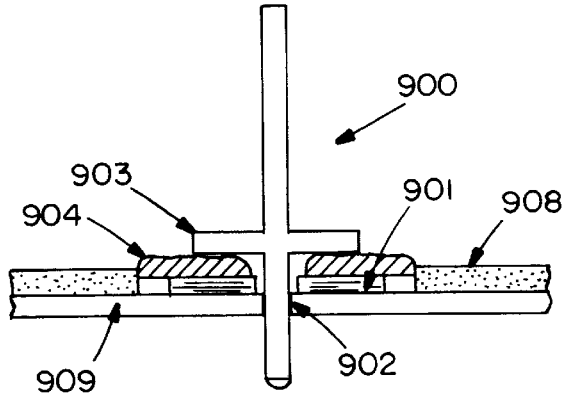
Figure 9E:
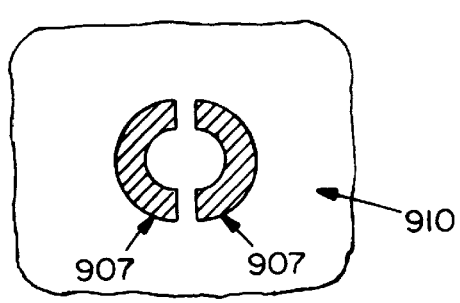
Figure 9D:
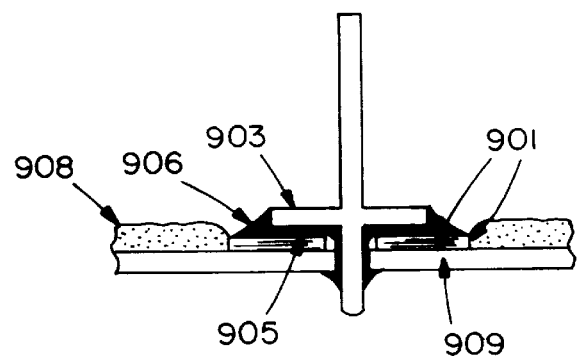

First, as shown in FIG. 9a, a pad 901 of exposed conductor around the hole 902 in the PCB 909 is made slightly larger in diameter than the diameter of the flange 903. Second, as shown in FIG. 9b, solder paste 904 is applied to pad 901. Third, the dc/dc converter is placed on the PCB such that pin 900 is inserted into hole 902 until the bottom of flange 903 rests on the solder paste 904, as shown in FIG. 9c. The PCB and dc/dc converter are then passed through a reflow oven, which raises the temperature of everything until the solder past melts. Once melted, the solder wicks both down into the hole 902 and up the side of the flange 903. Finally, the solder is allowed to cool and solidify. The result, shown in FIG. 9d, is a solder joint (or connection) 905 between the pin and the PCB that exists within the hole, underneath the flange and along the side of the flange. The "fillet region" 906 of the solder along the side of the flange provides additional mechanical strength to the solder connection and provides visual assurance that the solder has filled the region between the flange and pad. For best performance, the fillet should have a concave shape, as shown in the figure. Similarly, there should be a fillet 907 where the pin protrudes through the PCB.

A typical way to apply the solder paste 904 to the pad 901 is to screen-print it onto the pad at the same time that solder paste is screen-printed onto the pads for the PCB's other SMT components. However, pad 901 has a hole in the center of it and it is preferable to not screen-print solder paste over this hole. FIG. 9e shows one way to configure the opening 907 in the screen-printing stencil 910 to achieve this result.

It is important to apply sufficient solder paste to the pad 901 so that the solder connection will be electrically and mechanically sound. It is also important to avoid too much paste, although this condition is generally less of a problem.

Depending on the size of the dc/dc converter's pin and its PCB hole, the amount of paste desired may be more than the amount applied by a screen-printing process that works for the other, SMT components on the PCB. One way to get additional solder paste on pad 901 is to "overprint" the solder paste. With this approach, the opening 907 in the screen-printing stencil 910 is larger in diameter than the pad 901. The solder paste printed outside the pad area initially sits on top of the solder mask 908. During the reflow process, as this solder paste melts it is drawn off the solder mask and into the desired solder joint region by the action of surface tension.

Another way to apply the correct amount of solder paste on pad 901 is to dispense it through a needle, rather than screen-print it. This dispensing process could be either manual or automatic.

A third way to apply the correct amount of solder on pad 901 is to use a "solder preform", which is a thin sheet of solidified solder that has the desired shape and thickness and total volume of solder. This preform can be applied to pad 901 with either a manual or automatic process.

Another way to apply the solder is to preapply it directly to the shoulder of the flange before the flange is positioned against the pad. For example, the solder could be coated on the underside of the flange, could be applied as a paste, or could be applied as a solder preform. The solder could be preapplied by the final installer or could be preapplied by the pin or converter manufacturer.

With both the dispensing and the pre-form approaches for applying solder, it is again possible for the solder to extend initially beyond the pad 901 and to sit on top of the solder mask 908. As with the overprinting approach, the solder will be drawn off the solder mask and into the solder joint region by surface tension during the reflow process.

Some experimentation will be required to determine how much solder paste should be applied in a given situation. The amount will depend on issues such as which solder application method is chosen, the size of the pin, its flange, and the hole, the thickness of the PCB, the number and thickness of the conductors in the PCB, the details of the reflow process, etc. An SMT process engineer of ordinary skill in the art would generally be able to determine a good starting point for this experimentation. Then, by mechanically inspecting the resultant solder connection between the pin and the PCB, the engineer could easily determine whether the amount of solder used was too little or too much. In this manner, a final solution could be found after just a few iterations.

As an example of how much solder might be used, consider the following:

1) shank diameter=80 mils
2) flange diameter=120 mils
3) flange thickness=40 mils
4) hole diameter=90 mils
5) pad diameter=160 mils
6) PCB thickness=90 mils
7) 6 layers of 4 oz. and 2 layers of 2 oz. copper within the PCB
8) reflow process: 5 min ramp-up time, 210° C. peak temp for 1 min, 2 min ramp-down time For this situation it has been determined that a solder volume of 106 cubic mils gave a good solder connection.

Because the dc/dc converter and its pins usually have a higher thermal mass than other components on the PCB, the ramp-up time and the ramp-down times in the reflow oven might need to be increased over the values used if the dc/dc converter were not present.

Since the dc/dc converter will be passed through a reflow oven, it is important to ensure that the converter's components, materials, and solder connections are not adversely affected during this process. For instance, the converter might be fabricated with higher temperature solder than the one used to attach the converter to the PCB. A PCB substrate within the converter might have a higher temperature rating (e.g. 150° C. or 185° C.) instead of the normal 130° C. rating.

A typical solder which would be used to join the terminal pin to the PCB has a melting temperature of 183° C. Thus, the conditions of the reflow oven are such that a peak temperature of the solder reaches about 210° C. as noted above at point 8. In order to assure the integrity of the dc/dc converter it is preferred that the solder used in the converter have a melting temperature greater than 210° C. Preferably, a solder having a melting temperature greater than 230° C. is used in the converter assembly.

A second method by which the new pin can be reflow-soldered to the PCB is as follows.

Figure 10A:
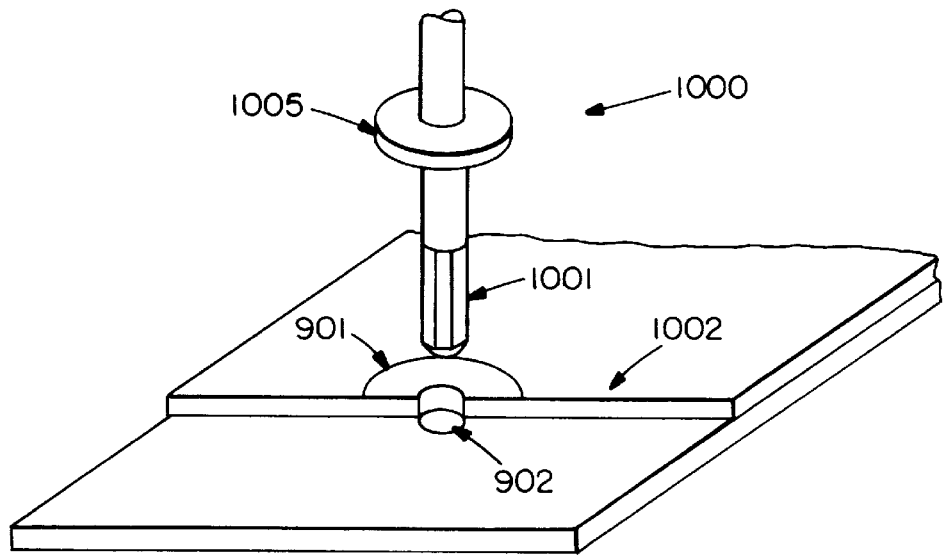
FIGS. 10a–c illustrate using a reflow process to solder a press-fit through-hole pin (having a cross-sectional pointed shape at its end) to a PCB or a substrate.

First, as shown in FIG. 10a, the bottom portion 1001 of the pin 1000 has a pointed shape to its cross-section so that it can be press fit into the PCB 1002.

Figure 10B:
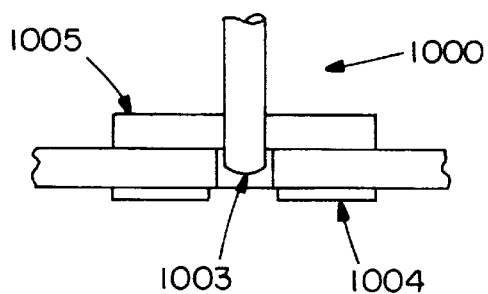

Second, when the pin is inserted into the PCB hole, the depth of the insertion is controlled to keep the bottom end 1003 of the pin from extending beyond the bottom surface 1004 of the PCB. Preferably, the bottom end of the pin should not reach the bottom PCB surface, but instead remain slightly (e.g. 15 mils) inside the PCB, as shown in FIG. 10b. FIG. 10b shows a flange 1005 near the bottom end of the pin that facilitates the correct insertion depth, although other means well known to those skilled in the art could be used instead. For instance, a machine could be used to insert the pins, and the range of the machine's motion could then be controlled to achieve the correct insertion depth.

Figure 10C:
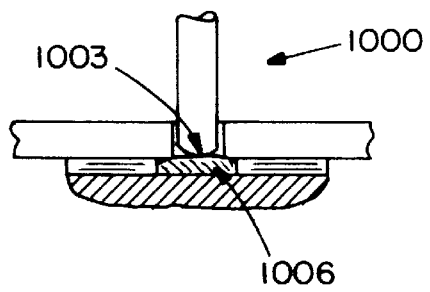

Third, with the dc/dc converter held in place by the press-fit pin, solder paste can be screen printed onto the bottom side of the PCB, as shown in FIG. 10c. Since the end 1003 of the pin does not extend beyond the bottom surface 1004 of the PCB, the pin does not interfere with this screen printing. In addition, by leaving the end of the inserted pin slightly (e.g. 15 mils) inside the PCB, a slight "well" 1006 is formed in the area of the hole. During the screen printing process, this well is filled with solder paste. The dimensions of the well can therefore be adjusted to achieve the desired amount of solder paste.

At this time, other SMT components can be placed on the bottom side of the PCB.

The PCB is then passed through a reflow oven where the solder melts, flows down into the gaps between the pin and the hole, and then solidifies.

This same method can be used to solder the pin to the dc/dc converter's substrate during the construction of the converter. The pin in this figure does not have a flange near the end of the pin that is inserted into the substrate, although it might.

Figure 11:
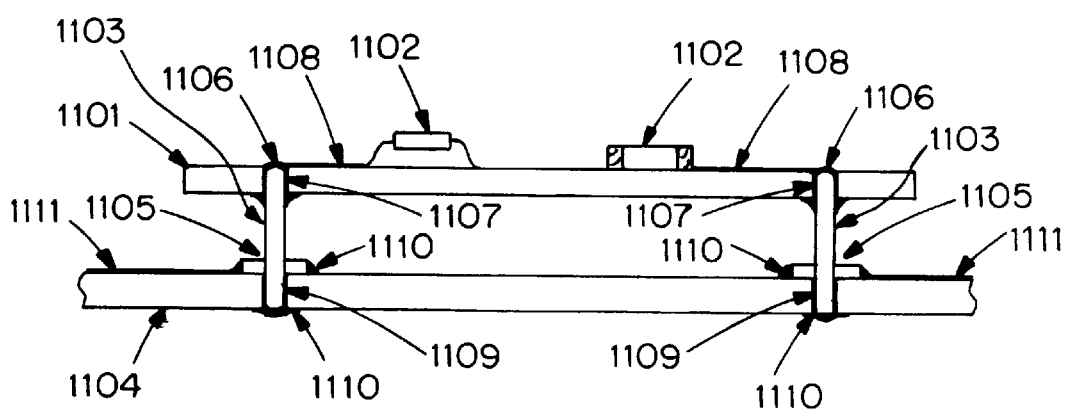
FIG. 11 is a cross-sectional view of a converter module mounted to a printed circuit board in accordance with the invention.

FIG. 11 shows how the final assembly might look in cross-section. The open-frame dc/dc converter has a substrate 1101 on which circuitry 1102 is attached. Only a few circuit components are shown in this figure for simplicity. In general, there would be many components mounted on both sides of the converter substrate 1101.

Several terminal pins 1103 with flanges 1105 are swage fit into holes 1106 of the converter substrate. These pins are then soldered to the holes in the spaces 1107 between the pins and the side walls of the holes. Conductive traces 1108 on the converter substrate 1101 electrically connect the terminal pins to circuitry 1102.

The other end of pins 1103 are inserted into the printed circuit board 1104. The shoulder of the flange 1105 of these pins abuts the printed circuit board.

Solder 1109 connects the pin 1103 and its flange 1105 to conductive pads on the printed circuit board and the sidewalls of the holes. Fillets 1110 of solder are formed around the flanges and around the end of the pin that extends through the printed circuit board.

The terminal pins 1103 are connected electrically to other parts of the printed circuit board through conductive traces 1111.

While this invention has been particularly shown and described with references to preferred embodiments thereof, it will be understood by those skilled in the art that various changes in form and details may be made therein without departing from the scope of the invention encompassed by the appended claims.

What is claimed is:

1. A dc/dc converter comprising:
   a converter substrate having circuitry thereon, including components mounted on both sides thereof; and
   at least one rigid terminal pin of circular cross-section directly attached to the converter substrate, the pin being electrically connected to the circuitry, the terminal pin including only a single flange, the flange having a shoulder to abut a printed circuit board into which the pin is inserted and to which electrical connection is made, the shoulder being spaced from the converter substrate to accommodate standoff spacing of the converter substrate from the printed circuit board sufficient for components mounted to the converter substrate.

2. A dc/dc converter as claimed in claim 1 wherein the components, materials and solder connections of the converter are not adversely affected by a 210° C. soldering process.

3. A dc/dc converter as claimed in claim 1 wherein solder used on the converter substrate has a melting temperature greater than 210° C.

4. A dc/dc converter as claimed in claim 1 wherein the flange extends along a length of the terminal pin to abut the converter substrate.

5. A dc/dc converter as claimed in claim 4 wherein the flange has a uniform diameter.

6. A dc/dc converter as claimed in claim 1 wherein the terminal pin comprises a second shoulder which abuts the converter substrate.

7. A dc/dc converter as claimed in claim 6 wherein the terminal pin extends into the converter substrate.

8. A dc/dc converter as claimed in claim 7 wherein the terminal pin is swage fit into the converter substrate.

9. A dc/dc converter as claimed in claim 8 wherein the portion of the terminal pin extending into the converter substrate has a pointed cross sectional shape.

10. A dc/dc converter as claimed in claim 9 wherein the portion of the terminal pin extending into the converter substrate is soldered to the converter substrate.

11. A dc/dc converter as claimed in claim 10 wherein the terminal pin is soldered to the converter substrate with a reflow soldering process.

12. A dc/dc converter as claimed in claim 1 wherein the terminal pin extends into the converter substrate.

13. A dc/dc converter as claimed in claim 12 wherein the pin is swage fit into the converter substrate.

14. A dc/dc converter as claimed in claim 13 wherein the portion of the pin extending into the converter substrate has a pointed cross section shape.

15. A dc/dc converter as claimed in claim 14 wherein the portion of the terminal pin extending into the converter substrate is soldered to the converter substrate.

16. A dc/dc converter as claimed in claim 15 wherein the terminal pin is soldered to the converter substrate with a reflow soldering process.

17. A dc/dc converter as claimed in claim 1 further comprising preapplied solder on the shoulder of the flange.

18. A dc/dc converter as claimed in claim 17 wherein the solder is in a paste.

19. A dc/dc converter as claimed in claim 17 wherein the solder is a preform.

20. A dc/dc converter as claimed in claim 17 wherein the solder is coated on the shoulder.

21. A dc/dc converter comprising:
a converter substrate having circuitry thereon, including components mounted on both sides thereof, in an open frame construction without a base plate; and
at least one rigid terminal pin of circular cross-section directly attached to a major face of the converter substrate, the pin being electrically connected to the converter circuitry, the pin including only a single flange, the flange having a shoulder to abut a printed circuit board into which the pin is inserted and to which electrical connection is made, the shoulder being spaced from the converter substrate to standoff the substrate from the printed circuit board with the converter substrate parallel to the printed circuit board.

22. A dc/dc converter as claimed in claim 21 wherein the components, materials and solder connections of the converter are not adversely affected by a 210° C. soldering process.

23. A dc/dc converter as claimed in claim 21 wherein solder used on the converter substrate has a melting temperature greater than 210° C.

24. A dc/dc converter as claimed in claim 19 wherein the flange extends along a length of the terminal pin to abut the converter substrate.

25. A dc/dc converter as claimed in claim 21 wherein the flange has a uniform diameter.

26. A dc/dc converter as claimed in claim 21 wherein the terminal pin comprises a second shoulder which abuts the converter substrate.

27. A dc/dc converter as claimed in claim 26 wherein the terminal pin is swage fit into the converter substrate.

28. A dc/dc converter as claimed in claim 27 wherein the portion of the terminal pin extending into the converter substrat as a pointed cross sectional shape.

29. A dc/dc converter as claimed in claim 28 wherein the portion of the terminal pin extending into the converter substrate is soldered to the converter substrate.

30. A dc/dc converter as claimed in claim 29 wherein the terminal pin is soldered to the converter substrate with a reflow soldering process.

31. A dc/dc converter as claimed in claim 21 wherein the pin is swage fit into the converter substrate.

32. A dc/dc converter as claimed in claim 31 wherein the portion of the pin extending into the converter substrate has a pointed cross section shape.

33. A dc/dc converter as claimed in claim 32 wherein the portion of the terminal pin extending into the converter substrate is soldered to the converter substrate.

34. A dc/dc converter as claimed in claim 33 wherein the terminal pin is soldered to the converter substrate with a reflow soldering process.

35. A dc/dc converter as claimed in claim 21 further comprising preapplied solder on the shoulder of the flange.

36. A dc/dc converter as claimed in claim 35 wherein the solder is in a paste.

37. A dc/dc converter as claimed in claim 35 wherein the solder is a preform.

38. A dc/dc converter as claimed in claim 35 wherein the solder is coated on the shoulder.

39. A dc/dc converter assembly comprising:
a dc/dc converter comprising:
a converter substrate having circuitry thereon, including components mounted on both sides thereof; and
at least one rigid terminal pin of circular cross-section directly attached to the converter substrate, the pin being electrically connected to the circuitry, the terminal pin including only a single flange, the flange having a shoulder thereon, the shoulder being spaced from the converter substrate; and
a printed circuit board into which the terminal pin of the dc/dc converter is inserted with the shoulder abutting the printed circuit board through solder between the shoulder and the printed circuit board, the terminal pin being soldered to the printed circuit board to make electrical connection thereto with the converter substrate spaced from the printed circuit board by a standoff space determined by the flange shoulder.

40. A dc/dc converter assembly as claimed in claim 39 wherein the components, materials and solder connections of the converter are not adversely affected by a 210° C. soldering process.

41. A dc/dc converter assembly as claimed in claim 39 wherein solder used on the converter substrate has a melting temperature greater than 210° C.

42. A dc/dc converter assembly as claimed in claim 39 wherein the flange extends along a length of the terminal pin to abut the converter substrate.

43. A dc/dc converter assembly as claimed in claim 42 wherein the flange has a uniform diameter.

44. A dc/dc converter assembly as claimed in claim 39 wherein the terminal pin comprises a second shoulder which abuts the converter substrate.

45. A dc/dc converter assembly as claimed in claim 44 wherein the terminal pin extends into the converter substrate.

46. A dc/dc converter assembly as claimed in claim 45 wherein the terminal pin is swage fit into the converter substrate.

47. A dc/dc converter assembly as claimed in claim 46 wherein the portion of the terminal pin extending into the converter substrate has a pointed cross sectional shape.

48. A dc/dc converter assembly as claimed in claim 47 wherein the portion of the terminal pin extending into the converter substrate is soldered to the converter substrate.

49. A dc/dc converter assembly as claimed in claim 48 wherein the terminal pin is soldered to the converter substrate with a reflow soldering process.

50. A dc/dc converter assembly as claimed in claim 47 wherein the terminal pin extends into the converter substrate.

51. A dc/dc converter assembly as claimed in claim 50 wherein the pin is swage fit into the converter substrate.

52. A dc/dc converter assembly as claimed in claim 51 wherein the portion of the pin extending into the converter substrate has a pointed cross section shape.

53. A dc/dc converter assembly as claimed in claim 52 wherein the portion of the terminal pin extending into the converter substrate is soldered to the converter substrate.

54. A dc/dc converter assembly as claimed in claim 53 wherein the terminal pin is soldered to the converter substrate with a reflow soldering process.

* * * * *

UNITED STATES PATENT AND TRADEMARK OFFICE
CERTIFICATE OF CORRECTION

PATENT NO. : 6,545,890 B2
APPLICATION NO. : 09/740707
DATED : April 8, 2003
INVENTOR(S) : Lennart Pitzele It is certified that error appears in the above-identified patent and that said Letters Patent is hereby corrected as shown below:

In Column 11

Claim 24, line 52, delete "19" and insert --21--;

Claim 25, line 55, delete "21" and insert --24--.

Signed and Sealed this

Twenty-fifth Day of December, 2007

JON W. DUDAS
*Director of the United States Patent and Trademark Office*